United States Patent [19]

Yamagiwa et al.

[11] 4,326,223

[45] Apr. 20, 1982

[54] VIDEO SIGNAL RECORDING AND/OR REPRODUCING APPARATUS WITH GAIN CONTROL

[75] Inventors: Kazuo Yamagiwa, Tokyo; Yukihiko Machida, Kawasaki, both of Japan

[73] Assignee: Sony Corporation, Tokyo, Japan

[21] Appl. No.: 34,749

[22] Filed: Apr. 30, 1979

[30] Foreign Application Priority Data

May 2, 1978 [JP] Japan .................. 53-53108

[51] Int. Cl.³ .......................... H04N 5/79
[52] U.S. Cl. .................. 360/33; 360/65; 360/67; 358/127; 358/177; 358/166
[58] Field of Search ........... 358/127, 177, 167, 166, 358/174, 170; 360/33, 25, 67, 65; 179/1 P; 333/14; 330/278

[56] References Cited

U.S. PATENT DOCUMENTS

| | | | |
|---|---|---|---|
| 3,288,930 | 11/1966 | Johnson | 358/166 |
| 3,501,585 | 3/1970 | De Lampe | 360/67 |
| 3,944,853 | 3/1976 | Cooper | 360/67 |
| 3,980,815 | 9/1976 | Kaneko | 358/170 |
| 4,015,076 | 3/1977 | Ishiodori | 358/8 |
| 4,091,420 | 5/1978 | Omori | 358/166 |
| 4,122,502 | 10/1978 | Kobayoshi | 360/25 |
| 4,198,650 | 4/1980 | Hongu | 360/33 |
| 4,200,889 | 4/1980 | Strobel | 360/65 |

FOREIGN PATENT DOCUMENTS

| | | | |
|---|---|---|---|
| 874701 | 8/1961 | United Kingdom | 358/127 |
| 1068247 | 5/1967 | United Kingdom | 358/166 |
| 1230217 | 4/1971 | United Kingdom | 358/127 |
| 1532108 | 11/1978 | United Kingdom | 358/127 |
| 2000666 | 1/1979 | United Kingdom | 358/127 |

OTHER PUBLICATIONS

*Electronic Engineering*, by Alley et al., ©1967, pp. 672-674.

*Primary Examiner*—Vincent P. Canney
*Assistant Examiner*—Alan Faber
*Attorney, Agent, or Firm*—Lewis H. Eslinger; Alvin Sinderbrand

[57] ABSTRACT

In apparatus for reproducing a video signal which is recorded on a recording medium with a luminance component thereof non-linearly pre-emphasized and the signal portions thereof greater than a predetermined level being clipped; there are provided a non-linear de-emphasizing circuit which non-linearly attenuates the reproduced luminance component in a manner substantially complementary to the amount of the non-linear pre-emphasis, a gain control element, for example, in the form of a transistor, having a variable gain, and a compensating circuit for substantially recovering the clipped signal portions upon reproduction of the video signal, and in which the compensating circuit increases the gain of the gain control element for the portions of the reproduced luminance component at the predetermined level. The compensating circuit desirably includes a switching diode connected at one terminal to the collector of the gain control transistor and to a reference voltage at the other terminal such that the diode is made conductive for the portions of the reproduced luminance component of the video signal at the predetermined level to increase the gain of the transistor at the collector thereof.

26 Claims, 9 Drawing Figures

VIDEO SIGNAL RECORDING AND/OR REPRODUCING APPARATUS WITH GAIN CONTROL

BACKGROUND OF THE INVENTION

1. Field of the Invention

This invention relates generally to video signal recording and/or reproducing apparatus and, more particularly, is directed to improvements in such apparatus of the type in which, before recording with frequency or other angle modulation, the video signal is pre-emphasized and clipped, and, on reproduction, the reproduced signal is demodulated and then de-emphasized.

2. Description of the Prior Art

It is well known to record information signals, such as video signals, on a magnetic tape or other recording medium. In the case of video tape recorders, when recording color video signals which include a luminance component and a chrominance component, it is known to separate such components and then to frequency modulate the luminance component on a carrier having a relatively high frequency. However, the level of the FM noise signal increases with the frequency of the carrier of the frequency modulated luminance component in a recording and reproducing system using a magnetic tape and a magentic head, so that, if a high carrier frequency is employed, the FM noise signal has a correspondingly high level.

In this regard, in order to compensate for the level of the FM noise signal, prior art systems have pre-emphasized the luminance component of the video signal prior to recording to reduce the influence of such noise. However, when the amount of emphasis provided by the pre-emphasis circuit is increased for the purpose of eliminating the high level FM noise signal, relatively large overshoots are produced at those portions of the video signal where the level of the latter is abruptly changed, that is, large overshoots are produced at the rise and fall portions of the video signal due to the pre-emphasis. When the emphasized video signal with such large overshoots is employed as the modulating signal for the frequency modulation, frequency shifts corresponding to such large overshoots result in overmodulation and are too great to be included in the transmission band of the apparatus, that is, the band of frequencies that can be magnetically recorded and reproduced, so that the recording and reproducing of the video signal cannot be effected with a linear characteristic. In order to bring the frequency modulated video signal, as recorded and reproduced, within the transmission band, existing recording and reproducing apparatus are provided with a white clip circuit which limits the pre-emphasized video signal at a predetermined level so as to clip some of the overshoots prior to the frequency modulation of the carrier with the pre-emphasized video signal or its luminance component.

In the case of such limiting of the pre-emphasized luminance component of the video signal, however, even if the video signal is processed in a de-emphasis circuit, after demodulation, during the reproducing operation, it is not possible to obtain precisely the original video signal owing to the distortion of waveforms at the limited or clipped overshoot portions. More particularly, because of such clipping, the portions of the reproduced signal greater than the predetermined level are lost, resulting in a lengthening of the rise time between the rise and fall portions of the video signal, that is, the black and white portions of the video picture. As a result, a dull picture results in which black picture lines run onto adjacent white areas, causing so called smear around the peripheral portions of the black areas.

OBJECTS AND SUMMARY OF THE INVENTION

Accordingly, it is an object of this invention to provide a recording and/or reproducing apparatus that avoids the above-described difficulties encountered with the prior art.

More particularly, it is an object of this invention to provide a recording and/or reproducing apparatus in which an improved reproduced video picture is obtained without smear or the like.

Another object is to provide a recording and/or reproducing apparatus which substantially recovers and compensates for the clipped signal portions upon reproduction of the video signal.

Still another object is to provide a recording and/or reproducing apparatus in which the gain of an output gain control transistor is automatically increased when the reproduced video signal is at the predetermined clipping level.

A further object is to provide a recording and/or reproducing apparatus, as aforesaid, which is of relatively simple construction, and which may be conveniently employed in the video output circuit of a video tape recorder.

In accordance with an aspect of this invention, an apparatus for recording and reproducing an information signal on a recording medium comprises a recording section including clipping means for clipping portions of the information signal greater than a predetermined level; and a reproducing section having gain control means including a gain control element with a variable gain, and compensating means for substantially recovering the clipped signal portions upon reproduction of the information signal, wherein the compensating means increases the gain of the gain control element for portions of the reproduced information signal at the predetermined level.

In a preferred embodiment, the gain control element is a gain control transistor with a variable gain and having a collector and an emitter, and the compensating means includes a switching diode connected, at one terminal, to the emitter while a reference signal generating means is connected to the other terminal of the diode for supplying a predetermined reference signal thereto so that the diode is activated to an ON state for portions of the reproduced signal at the predetermined level, thereby to increase the gain of the gain control transistor at its collector.

In addition, the recording section preferably includes a linear pre-emphasis circuit and a non-linear compression circuit in advance of the clipping means and a frequency modulating circuit acting on the output of the clipping means, and the reproducing section further includes a demodulating circuit, and the gain control means further includes a de-emphasis circuit and a non-linear expansion circuit which are provided with responses substantially complementary to the pre-emphasis circuit and non-linear compression circuit, respectively.

The above, and other objects, features and advantages of the invention, will be apparent in the following detailed description of illustrative embodiments of the invention which is to be read in connection with the accompanying drawings.

DESCRIPTION OF THE PREFERRED EMBODIMENTS

Figure 1:
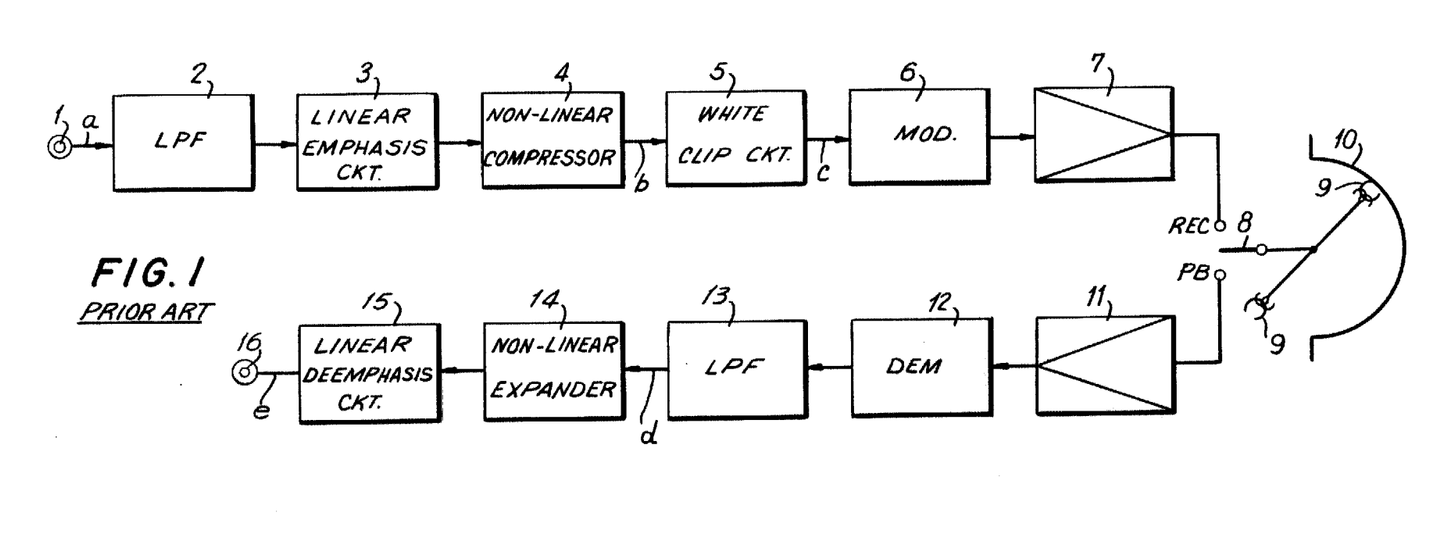
FIG. 1 is a block diagram showing a circuit for recording and reproducing video signals according to the prior art.

Referring to the drawings in detail, and initially to FIGS. 1 and 2 thereof, it will be seen that, in a video signal recording and reproducing apparatus according to the prior art, as there illustrated, a video signal a (FIG. 2A) is supplied to a low-pass filter 2 through an input terminal 1 for removing the high frequency components of the signal, such as, noise or the like, to obtain the luminance component of the video signal. In order to improve the signal-to-noise ratio (S/N) of the reproduced video signal, the luminance component is supplied, in succession, to a linear pre-emphasis circuit 3 and a non-linear compressing circuit 4 with characteristics which, in combination, cause such circuits to constitute a non-linear pre-emphasis circuit. Thus, circuits 3 and 4 combine to provide an amount of emphasis to the luminance component of the video signal which is dependent on both the level and frequency thereof, as described in U.S. patent application Ser. No. 971,678, filed Dec. 21, 1978, and which, in its relevant aspects, is incorporated herein.

Figure 2A:
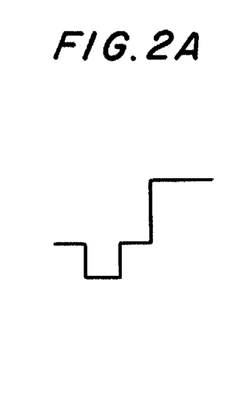
FIGS. 2A–2E are waveform diagrams to which reference will be made in explaining the problems associated with the prior art circuit of FIG. 1.
Figure 2B:
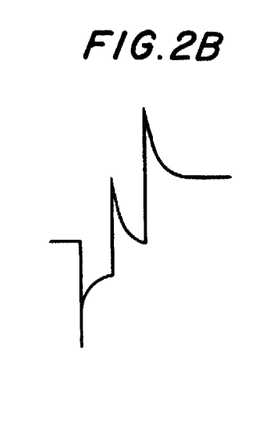

Linear pre-emphasis circuit 3 is provided with a large gain for pre-emphasizing the high frequency components of the signal supplied thereto and non-linear compressing circuit 4 acts on the output of pre-emphasis circuit 3 and compresses the output by increasing amounts in correspondence with increasing levels and increasing frequencies thereof for producing an output signal b, as shown in FIG. 2B. More particularly, when the input signal level to non-linear compressor 4 is relatively high, the higher frequency components thereof are suppressed to weaken the pre-emphasis effected through the linear pre-emphasis circuit 3. On the other hand, when the input signal level is relatively low, the suppressing function of non-linear compressing circuit 4 is lowered so as to allow the output from linear pre-emphasis circuit 3 to pass without any substantial effects from non-linear compressing circuit 4.

The output signal b from non-linear circuit 4 is supplied to a frequency modulator 6 having a relatively high carrier frequency for providing a relatively large frequency shift of the signal supplied thereto in order to maintain the resolution of the luminance component, due to the non-linear pre-emphasis of the signal. However, because of the non-linear pre-emphasis, relatively large overshoots are produced at those portions of the video signal where the level of the latter is abruptly changed, namely, at the rise and fall portions thereof, as shown in FIG. 2B. If this emphasized video signal with such large overshoots were employed as the modulating signal for the frequency modulation, in modulator 6, the frequency shifts corresponding to such larger overshoots would be too great to be included in the transmission band of the apparatus, that is, the band of frequencies that can be magnetically recorded and reproduced, so that the recording and reproducing of the video signal would not be effected with a linear characteristic. In other words, overmodulation would occur.

Figure 2C:
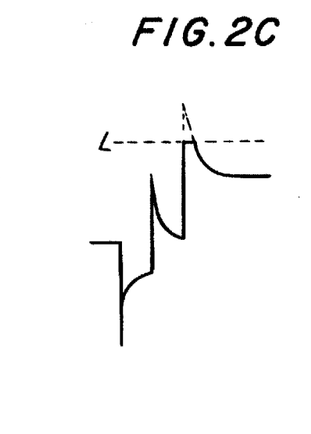

In order to bring the frequency modulated video signal, as recorded and reproduced, within the transmission band, a white clip circuit 5 acts on the signal b prior to modulation and after non-linear pre-emphasis to clip the overshoots of signal b which rise above a predetermined level L, as shown in FIG. 2C. Thus, the frequency deviation of the output of frequency modulator 6 is limited.

The frequency modulated signal is then supplied to rotary heads or transducers 9 through a recording amplifier 7 and a recording/reproducing change-over switch 8, which is then in its record position REC, to be recorded by heads 9 on a recording medium, such as, a magnetic tape 10.

Figure 2D:
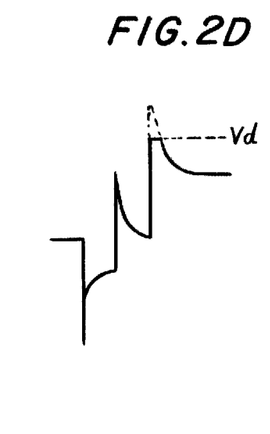

During the reproducing operation, a reproduced signal is supplied by heads or transducers 9 from magnetic tape 10 to a reproducing amplifier 11 through change-over switch 8 which is then in its playback position PB. The output signal from amplifier 11 is supplied to a frequency demodulator 12 and the output of the latter is passed through a low-pass filter 13, in which the carrier component is removed from the reproduced signal so as to obtain the reproduced luminance component or signal d of the video signal, as shown in FIG. 2D. This signal d is then supplied to a non-linear expanding circuit 14 for expanding the reproduced luminance component by increasing amounts in correspondance with increasing levels and increasing frequencies thereof in a manner substantially complementary to the amount of non-linear compression from non-linear compressing circuit 4. The output of non-linear expanding circuit 14 is supplied to a linear de-emphasis circuit 15 for attenuating the high frequency components of the reproduced luminance component in a manner substantially complementary to the amount of pre-emphasis from linear pre-emphasis circuit 3. The resulting reproduced signal e is supplied to an output terminal 16.

Figure 2E:
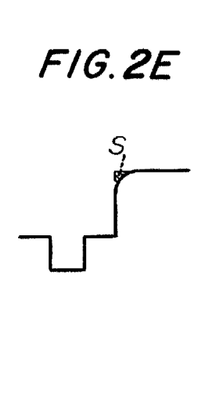

However, because a portion of the signal supplied to white clip circuit 5 has been clipped at a predetermined level, upon reproduction, the reproduced signal e at terminal 16 is missing a signal portion S corresponding to the clipped portion, as shown in hatched lines in FIG. 2E. As a result, the rise time of the signal at the rise and fall portions thereof, is longer, resulting in a somewhat dull picture in which black lines run on adjacent white areas of the picture, causing so-called smear around the peripheral portions of the black picture areas.

Figure 3:
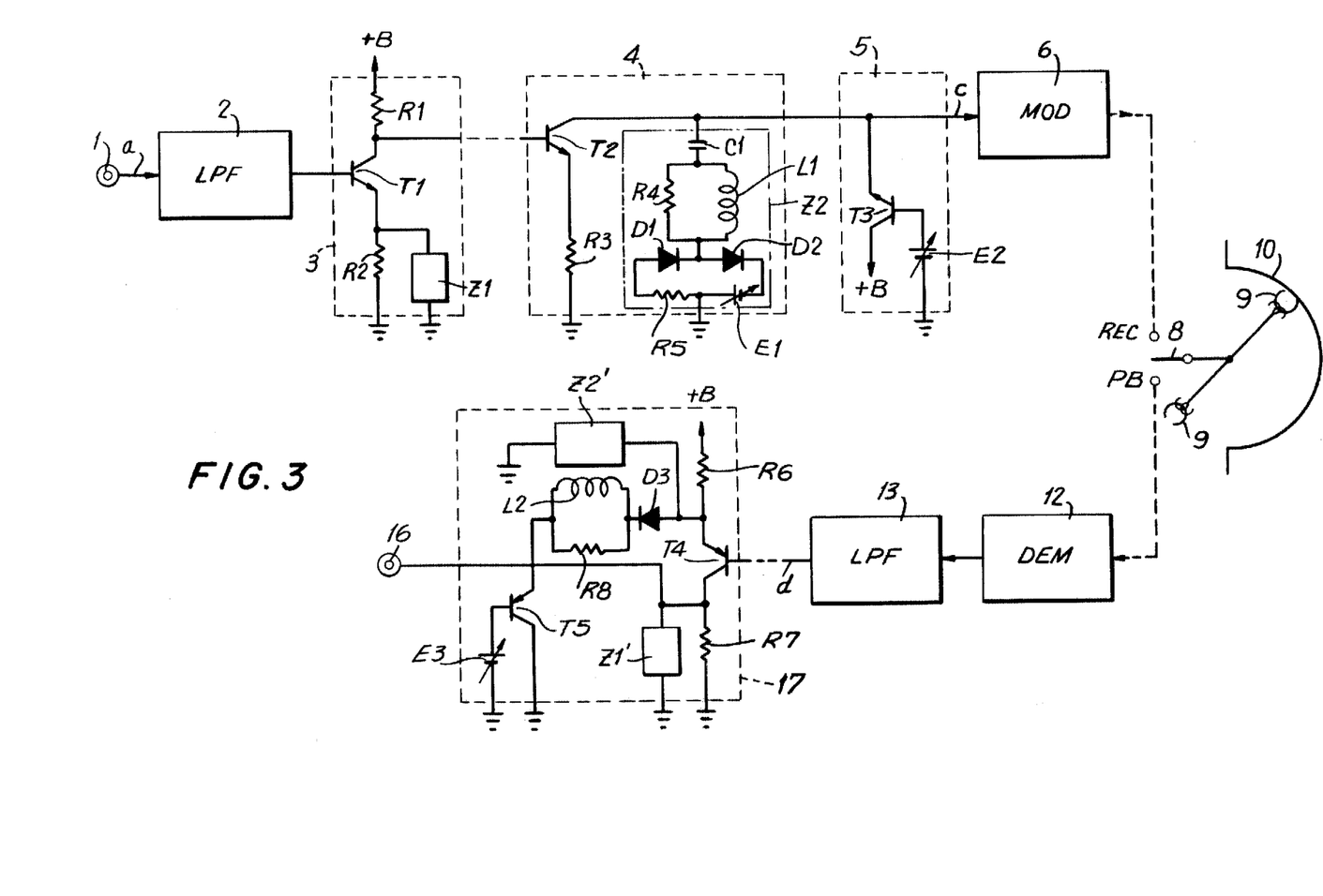
FIG. 3 is a circuit diagram, partly in block form, illustrating one embodiment of a recording and reproducing apparatus according to the present invention.

Referring now to FIG. 3, it will be seen that, in one embodiment of a recording and reproducing apparatus according to this invention, elements corresponding to those described above with reference to the prior art recording and reproducing apparatus of FIG. 1 are identified by the same reference numerals. In the recording section of the apparatus of FIG. 3, a video signal a is supplied to a low-pass filter 2 through an input terminal 1 to obtain the luminance component of the video signal in which the high frequency components thereof, such as noise or the like, are removed. The luminance component is supplied to a linear pre-emphasis circuit 3 to preemphasize the high frequency components of the signal. Linear pre-emphasis circuit 3 is shown to include a transistor T1, preferably an NPN bi-polar junction transistor having a base supplied with the output from low-pass filter 2, a collector connected to a voltage source +B through a resistor R1, and an emitter connected to ground through a resistor R2. Pre-emphasis circuit 3 further is shown to include an impedance circuit Z1, having a predetermined frequency characteristic and which is connected between the emitter of transistor T1 and a ground potential in parallel with resistor R2. The frequency characteristic of impedance circuit Z1 results in a decrease of the impedance of Z1 in a high frequency range, for example, above one MHZ, to increase the gain of pre-emphasis circuit 3. Accordingly, pre-emphasis circuit 3 emphasizes the high frequency components of the signal supplied thereto in a linear manner.

The output of linear pre-emphasis circuit 3, derived at the collector of transistor T1, is supplied to non-linear compressing circuit 4 which compresses the pre-emphasized output signal by increasing amounts in correspondance with increasing levels and increasing frequencies thereof. Non-linear compressing circuit 4 is shown on FIG. 3 to include a transistor T2 and a non-linear impedance circuit Z2. Transistor T2 is preferably an NPN bi-polar junction transistor having a base supplied with the output from pre-emphasis circuit 3 and an emitter connected to ground through a resistor R3. Impedance circuit Z2 is connected between the collector of transistor T2 and a ground potential and has a non-linear characteristic.

Impedance circuit Z2 may include an attentuator circuit having a capacitor C1 connected at one of its terminals to the collector of transistor T2 and a parallel circuit of an inductor L1 and resistor R4 connected to the opposite terminal of capacitor C1. Impedance circuit Z2 further includes a non-linear control circuit having a first diode D1 and resistor R5 in parallel with a second diode D2 and a reference voltage source E1, with the two diodes D1 and D2 being in series and with the combination of the diodes D1, D2, resistor R5 and voltage source E1 being connected between the attenuator circuit and a ground potential. In operation, the diodes D1 and D2 are turned ON when the signal level at the collector of transistor T2 is in a high frequency range and extends in the white noise region above a predetermined level. Turning ON of diodes D1 and D2 results in the signal level at the collector of transistor T2 being attenuated by the attenuator circuit. On the other hand, when the signal level in the high frequency range is lower than the predetermined level, the diodes D1 and D2 are turned OFF and the signal at the collector of transistor T2 is not attenuated.

The output of non-linear compressing circuit 4 at the collector of transistor T2 is supplied to white clip circuit 5, which is shown to include a transistor T3, preferably an NPN bi-polar junction transistor having a collector connected to a voltage source +B, a base connected to a predetermined reference voltage source E2 and an emitter connected to the collector of transistor T2. In this manner, when the level of the signal from nonlinear compression circuit 4 is greater than a predetermined level, transistor T3 turns ON and any signal portion higher than the predetermined white level L is clipped, as shown in FIG. 2C.

The output signal c from white clip circuit 5 is supplied to modulator 6 to frequency modulate a carrier and the frequency modulated signal is passed through change-over switch 8, in its recording position, to transducers 9 for recording on the magnetic tape 10.

Upon reproduction of the recorded signal, a reproduced luminance signal d is obtained after passing through frequency demodulator 12 and low-pass filter 13, as previously described.

In accordance with this invention, the reproduced signal d is supplied to a gain control means 17 which includes a gain control element, compensating means, linear deemphasizing means and non-linear expanding means. The gain control element is shown on FIG. 3 to include a transistor T4, preferably a PNP bi-polar junction transistor having a base supplied with the reproduced signal d and a collector connected to an output terminal 16 from which the final reproduced video signal is obtained.

Non-linear expanding means for expanding the reproduced signal d by increasing amounts in correspondence with increasing levels and increasing frequencies thereof in a manner substantially complementary to the non-linear compression circuit 4, is shown to include a non-linear impedance circuit Z2' which has a non-linear impedance-frequency response substantially complementary to nonlinear impedance circuit Z2 and which is connected in parallel with a resistor R6 connected to a voltage source +B, between the emitter of transistor T4 and a ground potential. Impedance circuit Z2', like impedance circuit Z2, is only affected by the AC signal because of a capacitor (not shown) which blocks out the DC signal. The nonlinear expansion means operates to recover the signal that is compressed through the non-linear compressing circuit 4, when the input signal d supplied to transistor T4 is at a high level. More particularly, when signal d is at a high level, impedance circuit Z2' lowers the impedance on the emitter side of transistor T4 so that the gain of transistor T4 is increased to expand the signal.

The linear de-emphasis circuit includes an impedance circuit Z1' connected in parallel with a resistor R7 between the collector of transistor T4 and a ground potential, and such impedance circuit Z2' has an impedance-frequency response substantially complementary to impedance circuit Z1 of pre-emphasis circuit 3. Accordingly, the signal at the collector of transistor T4 is attenuated at a predetermined rate in a predetermined high frequency range and the signal pre-emphasized before recording is restored by impedance circuit Z1', on reproduction. As a result, noise in the high frequency range, produced in the recording and reproducing operation on a magnetic tape, is attenuated by the de-emphasis means so as to improve the signal-to-noise ratio thereof.

The compensating means of gain control means 17 is provided for recovering the signal portion of the luminance component clipped prior to recording thereof. The compensating means is shown on FIG. 3 to include a diode D3 having the anode thereof connected to the emitter of transistor T4. The cathode of diode D3 is connected to a reference signal generating means through a parallel combination of an inductor L2 and resistor R8 which acts to prevent high frequency noise components from passing therethrough. The reference signal generating means includes a transistor T5, preferably a PNP bi-polar junction transistor having its collector connected to a ground potential and its emitter connected to the cathode of diode D3 through the parallel combination of inductor L2 and resistor R8. This parallel combination is provided to prevent transistor T4 from affecting the compensation operation due to noise in the high frequency range of the video signal due to an increase in the gain of transistor T4, especially when recording and reproducing on a magnetic tape. Thus, the gain of transistor T4 is suppressed in this noise region, which is determined by the time constant of inductor L2 and resistor R8. The reference signal generating means further includes a source E3 of a predetermined reference voltage supplied to the base of transistor T5, so that the potential at the emitter of transistor T5 is maintained at a constant value $E3 + V_{BE5}$, in which $V_{BE5}$ is the base-to-emitter potential of transistor T5.

When the reproduced luminance signal d, shown in FIG. 2D, which is supplied to transistor T4, is at the level $V_d$, representing the clipped portion thereof, the potential at the emitter of transistor T4 is at a level $V_d + V_{BE4}$, in which $V_{BE4}$ is the base-to-emitter potential of transistor T4, which is equal to $V_{BE5}$. Accordingly, at each clipped portion of the reproduced luminance component d, the voltage across diode D3 is $(V_d + V_{BE4}) - (E3 + V_{BE5})$, which is greater than the junction or cut-in voltage $V_{DAC}$ of diode D3. As a result, the diode D3 turns ON and the impedance of diode D3 decreases at the clipped portion. Since the impedance of diode D3 decreases, the impedance on the emitter side of transistor T4 also decreases, whereby to increase the gain of transistor T4, resulting in the clipped portion of the reproduced luminance component being substantially compensated or recovered, as shown by the dotted line above the clipped level $V_d$ in FIG. 2D. As a result, a reproduced signal having a similar waveform to FIG. 2A is obtained at output terminal 16 and virtually no smear of the video picture results.

Figure 4:
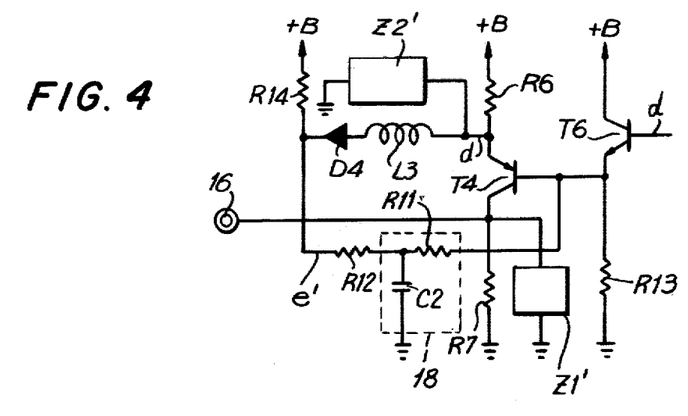
FIG. 4 is a circuit diagram illustrating a second embodiment of a gain control circuit which may be included in the reproducing section of an apparatus according to the present invention.
Figure 5:
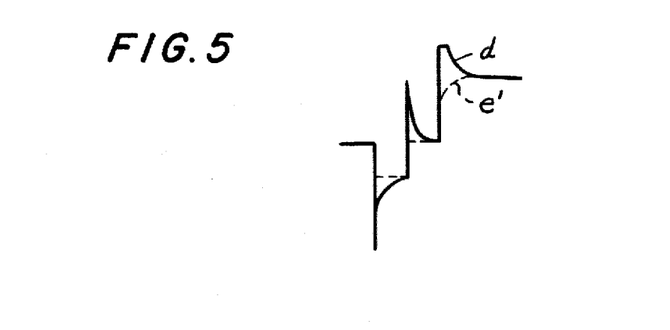
FIG. 5 is a waveform diagram for explaining a feature of the gain control circuit of FIG. 4.

An apparatus according to a second embodiment of this invention will now be described with reference to FIGS. 4 and 5, in which elements corresponding to those described with reference to the embodiment of FIG. 3 are identified by the same reference numerals. FIG. 4 illustrates only the gain control means 17 of the second embodiment which may otherwise be similar to FIG. 3. In FIG. 4, the reproduced luminance component d of the video signal is supplied to an emitter-follower transistor T6, preferably an NPN bi-polar junction transistor having an output emitter connected to a ground potential through a resistor R13 and a collector connected to a voltage source +B. The output from the emitter of transistor T6 is supplied to the input of a transistor T4 which corresponds to the similarly identified transistor in FIG. 3. The gain control means of FIG. 4 further includes a de-emphasis means having an impedance circuit Z1' and a non-linear expanding means having a non-linear impedance circuit Z2', both of which are virtually identical to the correspondingly identified circuits in FIG. 3.

In addition, a compensating means is provided which includes a diode D4 having its anode connected to the emitter of transistor T4 through an inductor L3, which is provided to prevent transistor T4 from affecting the compensation operation due to noise contained in the high frequency range of the reproduced luminance component d, in the same manner as previously described in regard to inductor L2 and resistor R8 in FIG. 3. The compensating means further includes a reference signal generating means having a lowpass filter 18 connected to the emitter output of transistor T6 and to the cathode of diode D4 through a resistor R12 for supplying a predetermined reference signal e' (FIG. 5) to the cathode of diode D4. Low-pass filter 18 includes a capacitor C2 connected to ground and to the emitter output of transistor T6 through a resistor R11. The cathode of diode D4 is also connected to a voltage source +B through a resistor R14.

In operation, and neglecting the base-to-emitter voltages of transistors T6 and T4, the potential at the emitter of transistor T4 has substantially the same level as the reproduced luminance component d of the video signal. Thus, the characteristics of low-pass filter 18 are chosen so that, when the level of the potential at the emitter of transistor T4 is substantially the same as the level of the reproduced luminance component d, the difference between this level and the level of the signal e' included in a lower frequency range of the reproduced luminance signal is greater than $V_{DAC}$ at the clipped portion of the luminance component d, in which $V_{DAC}$ is the junction or cut-in voltage of diode D4. As a result, diode D4 is turned ON in the region where the reproduced signal has been clipped so that the reproduced video signal d is positively fed back to the base of transistor T4 through diode D4 and resistors R12 and R11. Accordingly, since diode D4 is turned ON in this region, in the same manner as in the described operation of the apparatus of FIG. 3, the gain of transistor T4 is increased to compensate or recover the signal portion lost through the clipping action of white clip circuit 5. Moreover, the resistance value of resistor R12 may be selected so as to effectively eliminate the noise signal included in the higher frequency range of the signal that is fed back to the transistor T4 through resistor R12 and resistor R11, thereby to prevent any misoperation of the compensating means. Thus, a reproduced video signal having substantially the same waveform as the signal shown in FIG. 2A is obtained at output terminal 16.

It will be appreciated that the described application of the invention to a video signal of a video tape recorder is merely illustrative, and that the recording and/or reproducing apparatus according to this invention may have many applications to other information signals.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus having a section for reproducing an information signal from a recording medium on which said signal has been recorded with portions of said information signal greater than a predetermined level having been clipped, said section comprising a restoring circuit for restoring the clipped portion of the reproduced information signal including a gain control element having a variable gain, and compensating means DC coupled to said gain control element to cause the latter to have a first gain when said reproduced information signal is below said predetermined level and to have a second, higher gain for each said portion of said reproduced information signal when the latter reaches said predetermined level.

2. Apparatus according to claim 1; in which said gain control element is a gain control transistor, and said compensating means includes a switching device which is activated to an ON state for each said portion of said reproduced information signal at said predetermined level, and reference signal generating means for supplying a predetermined reference signal to said switching device.

3. Apparatus according to claim 2; in which said transistor is a bi-polar junction transistor having a base, an emitter, and a collector, and said switching device is a diode having a first electrode connected to said emitter and an second electrode supplied with said reference signal, said diode being activated to said ON state for each said portion of said reproduced signal at said predetermined level so as to increase the gain of said transistor at said collector thereof.

4. Apparatus according to claim 3; in which said reference signal generating means includes a reference transistor having an input and an output connected to the second electrode of said diode, and a predetermined voltage source for supplying a predetermined voltage to said input, said reference transistor maintaining said output thereof at a constant voltage.

5. Apparatus according to claim 3, wherein said compensating means includes an inductor coupled in series with said diode.

6. Apparatus according to claim 1; in which said information signal recorded on said recording medium is the luminance component of a video signal which has been subjected to a pre-emphasis of the high frequency components thereof, and said gain control element and said compensating means together comprise gain control means; and said gain control means acts with said de-emphasis means for attenuating the high frequency components of the reproduced luminance component in a manner substantially complementary to said amount of pre-emphasis.

7. Apparatus according to claim 6; in which said gain control element is a gain control transistor having an output and said de-emphasis means includes an impedance circuit connected to said output.

8. Apparatus according to claim 6; in which said luminance component of the recorded signal has been further subjected to a non-linear compression acting on said pre-emphasized signal and compressing said pre-emphasized signal by increasing amounts in correspondence with increasing levels and increasing frequencies thereof, and said gain control means acts with said non-linear expansion means for expanding the reproduced luminance component by increasing amounts in correspondence with increasing levels and increasing frequencies thereof in a manner substantially complementary to said amount of non-linear compression.

9. Apparatus according to claim 8; in which said gain control element is a gain control transistor having an output and said non-linear expansion means includes an impedance circuit connected to said output.

10. Apparatus according to claim 1; in which said information signal recorded on said recording medium is a video signal having a luminance component which is frequency modulated and said recording medium is a magnetic tape;

said apparatus further includes transducer means receiving said video signal and repeatedly scanning said magnetic tape for recording and reproducing said video signal in successive parallel tracks thereon; and said reproducing section further includes demodulating means for frequency demodulating the frequency modulated signals reproduced by said transducer means from the successive parallel tracks on said recording medium.

11. Apparatus having a section for reproducing an information signal from a recording medium on which said signal has been recorded with portions of said information signal greater than a predetermined level having been clipped, said section comprising a restoring circuit for restoring the clipped portion of the reproduced information signal including a gain control transistor having a variable gain, and compensating means causing said gain control transistor to have a first gain when said reproduced information signal is below said predetermined level, and to have a second, higher gain for each said portion of said reproduced information signal when the latter reaches said predetermined level, wherein said compensating means includes a switching device which is activated to an ON state for each said portion of said reproduced information signal at said predetermined level, and reference signal generating means for supplying a predetermined reference signal to said switching device; said transistor is a bi-polar junction transistor having a base, an emitter, and a collector, and said switching device is a diode having a first electrode connected to said emitter and a second electrode supplied with said reference signal, said diode being activated to said ON state for each said portion of said reproduced signal at said predetermined level so as to increase the gain of said transistor at said collector thereof; and said reference signal generating means includes a low-pass filter circuit connected between the base of said transistor and the second electrode of said diode.

12. Apparatus for recording and reproducing an information signal on a recording medium, comprising:

a recording section including clipping means for clipping portions of said information signal greater than a predetermined level; and a reproducing section including a restoring circuit for restoring the clipped portion of said reproduced information signal constituted by gain control means having a gain control element with a variable gain and compensating means DC coupled to said gain control element to cause the latter to have a first gain when said reproduced information signal is below said predetermined level, and to have a second, higher gain for said portions of said reproduced information signal when the latter reaches said predetermined level.

13. Apparatus according to claim 12; in which said information signal recorded on said recording medium is the luminance component of a video signal;

said recording section further includes pre-emphasis means for linearly pre-emphasizing high frequency components of said luminance component of said video signal, said pre-emphasis means including a first transistor having an output and a first impedance circuit connected to said output and which has an impedance decreasing at high frequencies of said luminance portion so as to increase the gain of said transistor; and said gain control means further includes de-emphasis means for linearly attenuating said pre-emphasized high frequency components of said luminance component in a manner substantially complementary to said amount of pre-emphasis.

14. Apparatus according to claim 13; in which said gain control element is a gain control transistor having an output, and said de-emphasis means includes a second impedance circuit connected to said output and which has an impedance-frequency response substantially complementary to the first impedance circuit of said pre-emphasis means.

15. Apparatus according to claim 14; in which said gain control transistor is a bi-polar junction transistor having a collector, said de-emphasis means includes a resistor in parallel with said second impedance circuit and the parallel connection of said resistor and second impedance circuit is connected to said collector.

16. Apparatus according to claim 14; in which
said recording section further includes non-linear compression means acting on the output of said pre-emphasis means for compressing said pre-emphasized output signal by increasing amounts in correspondence with increasing levels and increasing frequencies thereof; and said gain control means further includes non-linear expansion means for expanding the reproduced luminance component by increasing amounts in correspondence with increasing levels and increasing frequencies thereof in a manner substantially complementary to said non-linear compression means.

17. Apparatus according to claim 16; in which
said non-linear compression means includes a second transistor having an output and an input supplied with the output from said pre-emphasis means, and a first non-linear impedance circuit connected to said output of said second transistor; and said non-linear expansion means includes a second non-linear impedance circuit connected to said output of said gain control transistor and which has a non-linear impedance-frequency response substantially complementary to the first non-linear impedance circuit.

18. Apparatus according to claim 12; in which said clipping means includes a transistor having an input and an output supplied with said information signal, and a reference voltage supplied to said input.

19. Apparatus according to claim 12; in which said gain control element is a gain control transistor and said compensating means includes a switching device which is activated to an ON state for said portions of the reproduced information signal at said predetermined level, and a reference signal generating means for supplying a predetermined reference signal to said switching device.

20. Apparatus according to claim 19; in which said transistor is a bi-polar junction transistor having a base, an emitter, and a collector, said switching device is a diode having a cathode connected to said emitter and an anode supplied with said reference signal, and said diode is activated to the ON state for said portions of said reproduced signal at said predetermined level so as to increase the gain of said transistor at said collector.

21. Apparatus according to claim 20; in which said reference signal generating means includes a reference transistor having an input and an output connected to the anode of said diode, a predetermined voltage source for supplying a predetermined voltage to said input, and said reference transistor maintains said output at a constant voltage.

22. Apparatus according to claim 12; in which said information signal recorded on said recording medium is a video signal having a luminance component and said recording medium is a magnetic tape;

said apparatus further includes transducer means repeatedly scanning said magnetic tape for recording and reproducing said video signal in successive parallel tracks thereon;

said recording section further includes modulating means for frequency modulating said luminance component of the video signal on a carrier; and said reproducing section further includes demodulating means for frequency demodulating the frequency modulated signals reproduced by said transducer means from the successive parallel tracks on said recording medium.

23. Apparatus for recording and reproducing on a recording medium an information signal including at least the luminance component of a video signal, comprising a recording section including pre-emphasis means for linearly pre-emphasizing high frequency components of said luminance component, said pre-emphasis means including a first transistor having an output and a first impedance circuit connected to said output and which has an impedance decreasing at high frequencies of said luminance component so as to increase the gain of said transistor; non-linear compression means for compressing the output of the pre-emphasis means by increasing amounts in correspondence with increasing levels and increasing frequencies thereof, said non-linear compression means including a second transistor formed as a bi-polar junction transistor having a collector providing an output thereof, and having an input electrode coupled to the output of said pre-emphasis means, and a first non-linear impedance circuit formed of an attenuator circuit having a capacitor connected at one terminal to the collector of said second transistor and a parallel connection of an inductor and a resistor connected to the other terminal of said capacitor, and a non-linear control circuit having two diodes in series, a resistor and a reference voltage source connected, at the junction of said diodes, to said parallel connection of the inductor and resistor; and clipping means for clipping portions of said luminance component greater than a predetermined level; and a reproducing section including a bi-polar junction transistor arranged as a gain control transistor with variable gain and having an emitter, a base, and a collector providing a video output; de-emphasis means for linearly attenuating said pre-emphasized high frequency components of said luminance component in a manner substantially complementary to said amount of pre-emphasis, and formed of an impedance circuit connected to the collector of said bi-polar junction transistor and having an impedance-frequency response substantially complementary to the first impedance circuit of said pre-emphasis means; non-linear expansion means for expanding the reproduced luminance component by increasing amounts in correspondence with increasing levels and increasing frequencies thereof in a manner substantially complementary to said non-linear compression means, and formed of a second non-linear impedance coupled to said emitter of the gain control transistor, and a series connection of a resistor and a voltage source in parallel with said second non-linear impedance circuit and also connected to the emitter of said gain control transistor; and a restoring circuit for restoring the clipped portion of the reproduced luminance component having compensating means causing said gain control transistor to have a first gain when said reproduced luminance component is below said predetermined level, and to have a second, higher gain for said portions of the reproduced luminance component when the latter reaches said predetermined level.

24. Apparatus for recording and reproducing an information signal on a recording medium, comprising:

a recording section including clipping means for clipping portions of said information signal greater than a predetermined level; and a reproducing section including gain control means having a bi-polar junction transistor arranged as a gain control transistor with a variable gain and having a base, an emitter, and a collector, and compensating means increasing the gain of said control transistor for said portions of said reproduced information signal at said predetermined level for substantially recovering said clipped signal portion upon reproduction of said information signal, said compensating means including a switching diode having a first electrode connected to said emitter and a second electrode supplied with a reference signal, the switching diode being actuable to an ON state for portions of the reproduced information signal at said predetermined level so as to increase the gain of said transistor at said collector, and reference signal generating means providing said reference signal, and including a low-pass filter circuit connected between the base of said gain control transistor and the second electrode of said switching diode.

25. Apparatus having a section for reproducing an information signal from a record medium on which said signal has been recorded, at least a portion of the recorded signal having been provided with non-linear compression and with pre-emphasis, and having been clipped so that portions thereof exceeding a predetermined level are suppressed; said section comprising, in combination, de-emphasis means for providing to the reproduced information signal an amount of de-emphasis complementary to said pre-emphasis, non-linear expansion means for providing to the reproduced information signal an amount of expansion complementary to said compression, and restoring circuit means for restoring the clipped portions of the reproduced information signal including a gain control element having a variable gain and compensating means causing said gain control element to have a first gain when said reproduced information signal is below said predetermined level, and to have a second, higher gain for each said portion of said reproduced information signal when the latter reaches said predetermined level.

26. Apparatus for recording and reproducing an information signal on a recording medium, comprising a recording section including, in combination, a pre-emphasis stage for linearly pre-emphasizing high frequency components of said information signal, a non-linear compression stage for compressing the output of said pre-emphasis stage, and clipping means for clipping portions of the pre-emphasized and compressed information signal greater than a predetermined level; and a reproducing section including, in combination, de-emphasis means for linearly attenuating the emphasized high frequency portions of said information signal in a manner substantially complementary to said pre-emphasizing; non-linear expansion means for expanding the reproduced information signal in a manner substantially complementary to said compressing; and a restoring circuit for restoring the clipped portion of said reproduced information signal constituted by gain control means having a gain control element with a variable gain and compensating means causing said gain control element to have a first gain when said reproduced information signal is below said predetermined level, and to have a second, higher gain for said portions of said reproduced information signal when the latter reaches said predetermined level.

* * * * *